United States Patent
Bagal et al.

(10) Patent No.: US 12,125,699 B2
(45) Date of Patent: Oct. 22, 2024

(54) SELECTIVE CARBON DEPOSITION ON TOP AND BOTTOM SURFACES OF SEMICONDUCTOR SUBSTRATES

(71) Applicant: Applied Materials, Inc., Santa Clara, CA (US)

(72) Inventors: Abhijeet S. Bagal, Sunnyvale, CA (US); Qian Fu, Pleasanton, CA (US); Kuan-Ting Liu, Santa Clara, CA (US); Chung Liu, Hillsborough, CA (US)

(73) Assignee: Applied Materials, Inc., Santa Clara, CA (US)

( * ) Notice: Subject to any disclaimer, the term of this patent is extended or adjusted under 35 U.S.C. 154(b) by 297 days.

(21) Appl. No.: 17/359,947

(22) Filed: Jun. 28, 2021

(65) Prior Publication Data

US 2022/0415648 A1    Dec. 29, 2022

(51) Int. Cl.
*H01L 21/02* (2006.01)
*H01L 21/263* (2006.01)

(52) U.S. Cl.
CPC .. *H01L 21/02115* (2013.01); *H01L 21/02274* (2013.01); *H01L 21/2636* (2013.01)

(58) Field of Classification Search
CPC ......... H01L 21/02115; H01L 21/02274; H01L 21/2636
See application file for complete search history.

(56) References Cited

U.S. PATENT DOCUMENTS

| RE46,112 E * | 8/2016 | Crabtree ............ F16F 9/05 |
| 2004/0097077 A1 | 5/2004 | Nallan et al. |

(Continued)

FOREIGN PATENT DOCUMENTS

| WO | 2020190878 A1 | 9/2020 |
| WO | 2021-067092 A1 | 4/2021 |
| WO | 2021-162871 A1 | 8/2021 |

OTHER PUBLICATIONS

International Search Report and Written Opinion mailed on Oct. 13, 2022 in International Patent Application No. PCT/US2022/033835, 14 pages.

*Primary Examiner* — Monica D Harrison
*Assistant Examiner* — Andre C Stevenson
(74) *Attorney, Agent, or Firm* — Kilpatrick Townsend & Stockton LLP

(57) ABSTRACT

Semiconductor processing methods are described that include providing a substrate to a reaction chamber, where the substrate includes substrate trenches that have a top surface and a bottom surface. A deposition gas that includes a carbon-containing gas and a nitrogen-containing gas flows into a plasma excitation region of the reaction chamber. A deposition plasma having an electron temperature less than or about 4 eV is generated from the deposition gas. The methods further include depositing a carbon-containing layer on the top surface and the bottom surface of the substrate trenches, where the as-deposited carbon-containing layer has a top surface-to-bottom surface thickness ratio of greater than or about 3:1. Also described are semiconductor structures that include an as-deposited carbon-containing layer on the top and bottom surface of at least a first and second trench, where the carbon-containing layer has a top surface-to-bottom surface thickness ratio of greater than or about 3:1.

15 Claims, 5 Drawing Sheets

(56) References Cited

U.S. PATENT DOCUMENTS

| | | | |
|---|---|---|---|
| 2013/0344699 A1* | 12/2013 | Chiba | H01L 21/02274 438/700 |
| 2015/0021775 A1* | 1/2015 | Matsumoto | H01L 21/76864 438/786 |
| 2015/0287591 A1* | 10/2015 | Pore | H01L 21/0234 438/778 |
| 2017/0178920 A1 | 6/2017 | Dole et al. | |
| 2020/0273705 A1 | 8/2020 | Singh et al. | |
| 2020/0402801 A1 | 12/2020 | Shamma et al. | |

* cited by examiner

SELECTIVE CARBON DEPOSITION ON TOP AND BOTTOM SURFACES OF SEMICONDUCTOR SUBSTRATES

TECHNICAL FIELD

The present technology relates to semiconductor systems, processes, and equipment.

More specifically, the present technology relates to processes and structures for the selective deposition of carbon films.

BACKGROUND

Integrated circuits are made possible by processes which produce intricately patterned material layers on substrate surfaces. Producing patterned material on a substrate requires controlled methods of formation and removal of exposed material. Material characteristics may affect how the device operates, and may also affect how the films are removed relative to one another. Plasma-enhanced deposition may produce films having certain characteristics. Many films that are formed require additional processing to adjust or enhance the material characteristics of the film in order to provide suitable properties.

Thus, there is a need for improved systems and methods that can be used to produce high quality devices and structures. These and other needs are addressed by the present technology.

SUMMARY

Embodiments of the present technology include semiconductor processing methods that include providing a substrate to a reaction chamber, where the substrate includes substrate trenches that have a top surface and a bottom surface. The methods also include flowing a deposition gas into a plasma excitation region of the reaction chamber, where the deposition gas includes a carbon-containing gas and a nitrogen-containing gas. A deposition plasma having an electron temperature less than or about 4 eV is generated from the deposition gas. The methods further include depositing a carbon-containing layer on the top surface and the bottom surface of the substrate trenches, where the as-deposited carbon-containing layer has a top surface-to-bottom surface thickness ratio of greater than or about 3:1.

In additional embodiments, the deposition gas is argon free. In further embodiments, the deposition gas is helium free. In still further embodiments, the methods further include heating the substrate to a temperature greater than or about 100° C. before the deposition of the carbon-containing layer. In yet additional embodiments, the methods also include etching through at least a portion of the carbon-containing layer in the bottom surface of the substrate trenches, where the carbon-containing layer still covers the top surface of the substrate trenches. In more embodiments, the method still also includes removing the carbon-containing layer from the substrate after the etching of the at least one portion of the carbon-containing layer in the bottom surface of the substrate trenches. In still more embodiments, the carbon-containing gas includes methane. In yet more embodiments, the nitrogen-containing gas includes molecular nitrogen ($N_2$). In additional embodiments, the deposition plasma is generated by delivering RF power to the deposition gas, where the RF power is characterized by a power of less than or about 300 Watts. In further embodiments, the deposition plasma is characterized by a pressure of less than or about 10 mTorr.

Embodiments of the present technology also include semiconductor processing methods that include providing a substrate to a reaction chamber, where the substrate includes a first trench with a first aspect ratio greater than or about 2:1 and a second trench with a second aspect ratio less than or about 1:2. Each of the first and second trenches also have a top surface and a bottom surface. The methods further include heating the substrate to a temperature greater than or about 100° C. The methods also include flowing a deposition gas into a plasma excitation region of the reaction chamber, where the deposition gas includes a carbon-containing gas and a nitrogen-containing gas. A deposition plasma is generated from the deposition gas. The methods still further include depositing a carbon-containing layer on the heated substrate, where the as-deposited carbon-containing layer has a top surface-to-bottom surface thickness ratio of greater than or about 3:1 in both the first trench and the second trench.

In additional embodiments, the methods may also include etching through at least a portion of the carbon-containing layer in the bottom surface of the first substrate trench and the second substrate trench, where the carbon-containing layer still covers the top surface of the first substrate trench and the second substrate trench. In further embodiments, the methods may additional include removing the carbon-containing layer from the substrate after the etching of the at least a portion of the carbon-containing layer in the bottom surface of the first substrate trench and the second substrate trench. In still further embodiments, the deposition plasma is characterized by an electron temperature less than or about 4 eV. In yet additional embodiments, the first substrate trench is characterized by a first bottom width of less than or about 50 nm and the second substrate trench is characterized by a second bottom width of greater than or about 100 nm. In more embodiments, the carbon-containing layer is characterized by a top-surface thickness of greater than or about 5 nm, and a bottom-surface thickness of less than or about 1.6 nm. In still more embodiments, the carbon-containing layer includes solid carbon.

Embodiments of the present technology further include semiconductor structures that include a first trench and a second trench formed in at least one semiconductor material. The first trench and the second trench have a top surface and a bottom surface, where the first trench is characterized by a first aspect ratio greater than or about 2:1 and the second trench is characterized by a second aspect ratio of less than or about 1:2. The semiconductor structures may also include a dielectric layer in contact with the at least one semiconductor material, where the dielectric layer forms the top surface and the bottom surface of the first and the second trenches. The semiconductor structures may still also include a carbon-containing layer in contact with the dielectric layer on the top surface and the bottom surface of the first and the second trenches. The carbon-containing layer is characterized by a top-surface-to-bottom-surface thickness ratio of greater than or about 3:1 in both the first and the second trenches.

In additional embodiments, the dielectric layer may include silicon nitride. In further embodiments, the carbon-containing layer may include solid carbon. In still further embodiments, the dielectric layer is characterized by a bottom surface thickness of greater than or about 5 nm. In yet additional embodiments, the carbon-containing layer is characterized by a top-surface thickness of greater than or about 5 nm, and a bottom-surface thickness of less than or about 1.6 nm. In more embodiments, the semiconductor structures include a contact region positioned below the carbon-containing layer and the dielectric layer in the bottom surface of the first trench.

Such technology provides several benefits over conventional methods and structures to provide a thin, easily removable mask layer that protects the top and sidewall surfaces of a semiconductor trench while etching an opening in the bottom surface. Embodiments of the present methods include the use of a deposition gas that is selective for more deposition of a carbon-containing layer on a top surface of the trench than a bottom surface of the trench. The greater thickness of the carbon-containing layer on the top surface permits unbroken coverage of the layer on the top surface after an etch process has formed a hole through the layer in the bottom surface. This permits openings, such as contact holes and vias, to be formed in the bottom surface while the top and side surfaces of the trenches remain unetched. Embodiments of the present methods also include heating the bottom surface of the substrate trenches to a temperature that slows the deposition of the carbon-containing layer on the bottom surface relative to the top surface. These embodiments also selectively deposit more of the carbon-containing layer on the top surface of the trench than a bottom surface of the trench. These and other embodiments, along with many of their advantages and features, are described in more detail in conjunction with the below description and attached figures.

BRIEF DESCRIPTION OF THE DRAWINGS

A further understanding of the nature and advantages of the disclosed technology may be realized by reference to the remaining portions of the specification and the drawings.

Figure 1:
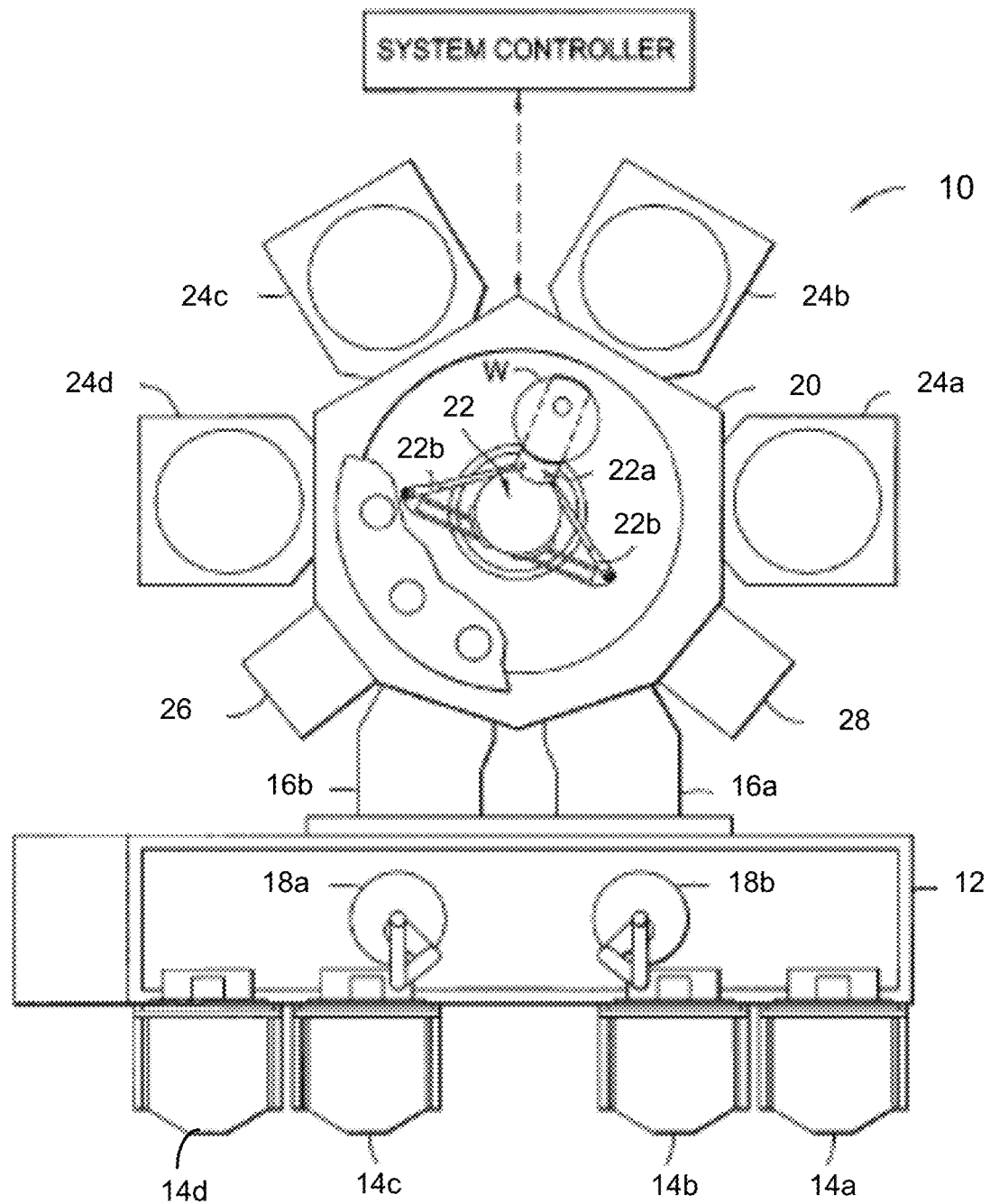
FIG. 1 shows a schematic top plan view of an exemplary processing system according to some embodiments of the present technology.

Several of the figures are included as schematics. It is to be understood that the figures are for illustrative purposes, and are not to be considered of scale unless specifically stated to be of scale. Additionally, as schematics, the figures are provided to aid comprehension and may not include all aspects or information compared to realistic representations, and may include exaggerated material for illustrative purposes.

In the appended figures, similar components and/or features may have the same reference label. Further, various components of the same type may be distinguished by following the reference label by a letter that distinguishes among the similar components. If only the first reference label is used in the specification, the description is applicable to any one of the similar components having the same first reference label irrespective of the letter.

DETAILED DESCRIPTION

A feature found in many semiconductor structures is an electrically conductive contact that extends from a semiconductor device layer to a metallization layer. In many cases, these contacts are fabricated by dry etching an opening in a dielectric material and filling the opening with an electrically conductive material such as aluminum, copper, or tungsten. In most of these cases, the fabrication operations also include the deposition of a mask layer to protect the unetched portions of the semiconductor devices during the etching operations. As semiconductor device sizes continue to shrink and the distance between adjacent devices also shrinks, it becomes more difficult for the etching operations to form openings without unintentionally etching some of the device.

One approach to protecting the semiconductor devices during an etching operation to form a contact is to cover the device structure with a layer of protection material such as carbon. The protection layer prevents top and sidewall surfaces of the device structure from being etched while the etching process etches an opening in a bottom surface that will subsequently be filled with an electrically conductive material. As semiconductor device structures get smaller, the protection layers get thinner. Unfortunately, protection layers made of easily removable materials such as carbon have gotten so thin (e.g., less than 10 nm) the etch process often breaks through the layer on both the top and bottom surface of trenches in the semiconductor devices. The etch processes do not have the spatial or temporal precision to etch the opening in the bottom surface of the trench without breaking through the protection layer deposited on the top surface and damaging the semiconductor device.

Embodiments of the present technology address, among other problems, the breakdown of protection layers on the top surface of a semiconductor device trench during the etching of a bottom surface of the trench. Embodiments of the present technology include methods of depositing a protection layer made of carbon to a greater thickness on the top surface of the trench than the bottom surface of the trench. The greater thickness of the as-deposited carbon-containing layer on the top surface of the trench reduces the chance that an etching operation breaks through the carbon-containing layer on the top surface. Etching operations that form an opening through the carbon-containing layer on the bottom surface of the trench, and often etch through one or more additional layers, leave the top surface of the device unetched.

Embodiments of the present technology include a plasma deposition gas that increases the selectivity of a plasma-assisted deposition of a carbon-containing layer for a top surface of a trench relative to its bottom surface. In embodiments, the deposition gas includes a carbon-containing gas such as methane. In additional embodiments, the deposition gas includes a nitrogen-containing gas such as molecular nitrogen. In still additional embodiments, the deposition gas is free of argon and other inert elements and compounds that have a higher molecular weight than molecular nitrogen. In further embodiments, the deposition gas is free of helium, and other gases of comparably low atomic/molecular weight, that significantly increase the temperature of the deposition plasma.

A complex relationship has been observed between the temperature of the plasma, the mass of the gases in the plasma, and differences in the carbon deposition rates at the top and bottom surfaces of a trench. For plasma gases with higher molecular weights like nitrogen and argon, the increase in the molecular weight of the gas correlates to an increase in the deposition rate at the bottom surface of the trench relative to the top surface. This is believed to be caused by an increase in the rate at which deposition molecules (e.g., methane) are carried to the bottom surface of the trench by heavier carrier species. However, an alternative challenge occurs in the case of helium, where the observed deposition rates of the carbon-containing protection layer at the top and bottom surfaces of the trench are closer together instead of further apart. Despite having a significantly lower atomic mass than nitrogen or argon, a significantly higher plasma temperature is produced by a helium-containing plasma than a nitrogen- or argon-containing plasma. The increased plasma temperature has a greater effect on the deposition rate of the carbon-containing layer at the top surface of the trench compared to the bottom surface, which causes lower deposition along the top surface of the trench.

While not wishing to be bound by a particular theory, carbon films deposit preferentially, or to a greater degree, on cooler surfaces due to a higher sticking coefficient. Helium plasma produces high temperature electrons, increasing a plasma temperature as well as increasing the temperature at the top surface of the trench. The increased temperature decreases the deposition rate of the carbon-containing layer at the top surface of the trench relative to the bottom surface. In the case of helium, the decreased deposition rate at the top surface of the trench is large enough to overtake the reduction in the deposition rate at the bottom surface due to the lower transport rate of the carbon-containing deposition molecules. Thus, deposition plasmas that contain helium as the predominant carrier species form a carbon-containing layer where the top and bottom surfaces are closer in thickness than a nitrogen-containing deposition plasma characterized by a lower plasma temperature. On the other hand, deposition plasmas that contain argon as the predominant carrier species produce carbon-containing layers where the top and bottom surfaces are closer in thickness like the helium-containing deposition plasmas. In these argon-containing deposition plasmas, the higher deposition rate at the bottom surface due to the increased transport rate for the heavier argon species overtake the favorable deposition conditions at the top surface due to the lower plasma temperatures.

It has further been observed that differences in the deposition rates of a carbon-containing layer between the top and bottom surfaces of trenches can occur over a range of substrate temperatures and trench widths. Thus, embodiments of the present technology can be used with substrates at temperatures of less than or about 100° C. as well as substrates at temperatures greater than or about 100° C. In addition, embodiments of the present technology can be used to deposit carbon-containing layers with different thickness on the top and bottom surface of trenches having widths less than or about 50 nm as well as trenches having widths greater than or about 100 nm. In further embodiments, the as-deposited carbon-containing layer may be deposited on a substrate having trenches having multiple different widths where the layer has a larger thickness on the top surface than the bottom surface of each of the trenches.

Although the remaining disclosure will routinely identify specific deposition and etching processes utilizing the present technology, it will be readily understood that the systems and methods are equally applicable to a variety of other processes and semiconductor structures that may be used in the described chambers. Accordingly, the technology should not be considered to be so limited as for use only with the described systems, methods, and chambers. The disclosure will discuss possible systems and chambers that can be used with the present technology before describing systems and methods or operations of exemplary process sequences according to some embodiments of the present technology. It is to be understood that the technology is not limited to the equipment described, and processes discussed may be performed in any number of processing chambers and systems.

FIG. 1 shows a top plan view of one embodiment of a processing system 10 of deposition, etching, baking, and/or curing chambers according to embodiments. The tool or processing system 10 depicted in FIG. 1 may contain a plurality of process chambers, 24a-d, a transfer chamber 20, a service chamber 26, an integrated metrology chamber 28, and a pair of load lock chambers 16a-b. The process chambers may include any number of structures or components, as well as any number or combination of processing chambers.

To transport substrates among the chambers, the transfer chamber 20 may contain a robotic transport mechanism 22. The transport mechanism 22 may have a pair of substrate transport blades 22a attached to the distal ends of extendible arms 22b, respectively. The blades 22a may be used for carrying individual substrates to and from the process chambers. In operation, one of the substrate transport blades such as blade 22a of the transport mechanism 22 may retrieve a substrate W from one of the load lock chambers such as chambers 16a-b and carry substrate W to a first stage of processing, for example, a treatment process as described below in chambers 24a-d. The chambers may be included to perform individual or combined operations of the described technology. For example, while one or more chambers may be configured to perform a deposition or etching operation, one or more other chambers may be configured to perform a pre-treatment operation and/or one or more post-treatment operations described. Any number of configurations are encompassed by the present technology, which may also perform any number of additional fabrication operations typically performed in semiconductor processing.

If the chamber is occupied, the robot may wait until the processing is complete and then remove the processed substrate from the chamber with one blade 22a and may insert a new substrate with a second blade. Once the substrate is processed, it may then be moved to a second stage of processing. For each move, the transport mechanism 22 generally may have one blade carrying a substrate and one blade empty to execute a substrate exchange. The transport mechanism 22 may wait at each chamber until an exchange can be accomplished.

Once processing is complete within the process chambers, the transport mechanism 22 may move the substrate W from the last process chamber and transport the substrate W to a cassette within the load lock chambers 16a-b. From the load lock chambers 16a-b, the substrate may move into a factory interface 12. The factory interface 12 generally may operate to transfer substrates between pod loaders 14a-d in an atmospheric pressure clean environment and the load lock chambers 16a-b. The clean environment in factory interface 12 may be generally provided through air filtration processes, such as HEPA filtration, for example. Factory interface 12 may also include a substrate orienter/aligner that may be used to properly align the substrates prior to processing. At least one substrate robot, such as robots 18a-b, may be positioned in factory interface 12 to transport substrates between various positions/locations within factory interface 12 and to other locations in communication therewith. Robots 18a-b may be configured to travel along a track system within factory interface 12 from a first end to a second end of the factory interface 12.

The processing system 10 may further include an integrated metrology chamber 28 to provide control signals, which may provide adaptive control over any of the processes being performed in the processing chambers. The integrated metrology chamber 28 may include any of a variety of metrological devices to measure various film properties, such as thickness, roughness, composition, and the metrology devices may further be capable of characterizing grating parameters such as critical dimensions, sidewall angle, and feature height under vacuum in an automated manner.

Each of processing chambers 24a-d may be configured to perform one or more process steps in the fabrication of a semiconductor structure, and any number of processing chambers and combinations of processing chambers may be used on multi-chamber processing system 10. For example, any of the processing chambers may be configured to perform a number of substrate processing operations including any number of deposition processes including cyclical layer deposition, atomic layer deposition, chemical vapor deposition, physical vapor deposition, as well as other operations including etch, pre-clean, pre-treatment, post-treatment, anneal, plasma processing, degas, orientation, and other substrate processes. Some specific processes that may be performed in any of the chambers or in any combination of chambers may be metal deposition, surface cleaning and preparation, thermal annealing such as rapid thermal processing, and plasma processing. Any other processes may similarly be performed in specific chambers incorporated into multi-chamber processing system 10, including any process described below, as would be readily appreciated by the skilled artisan.

Figure 2:
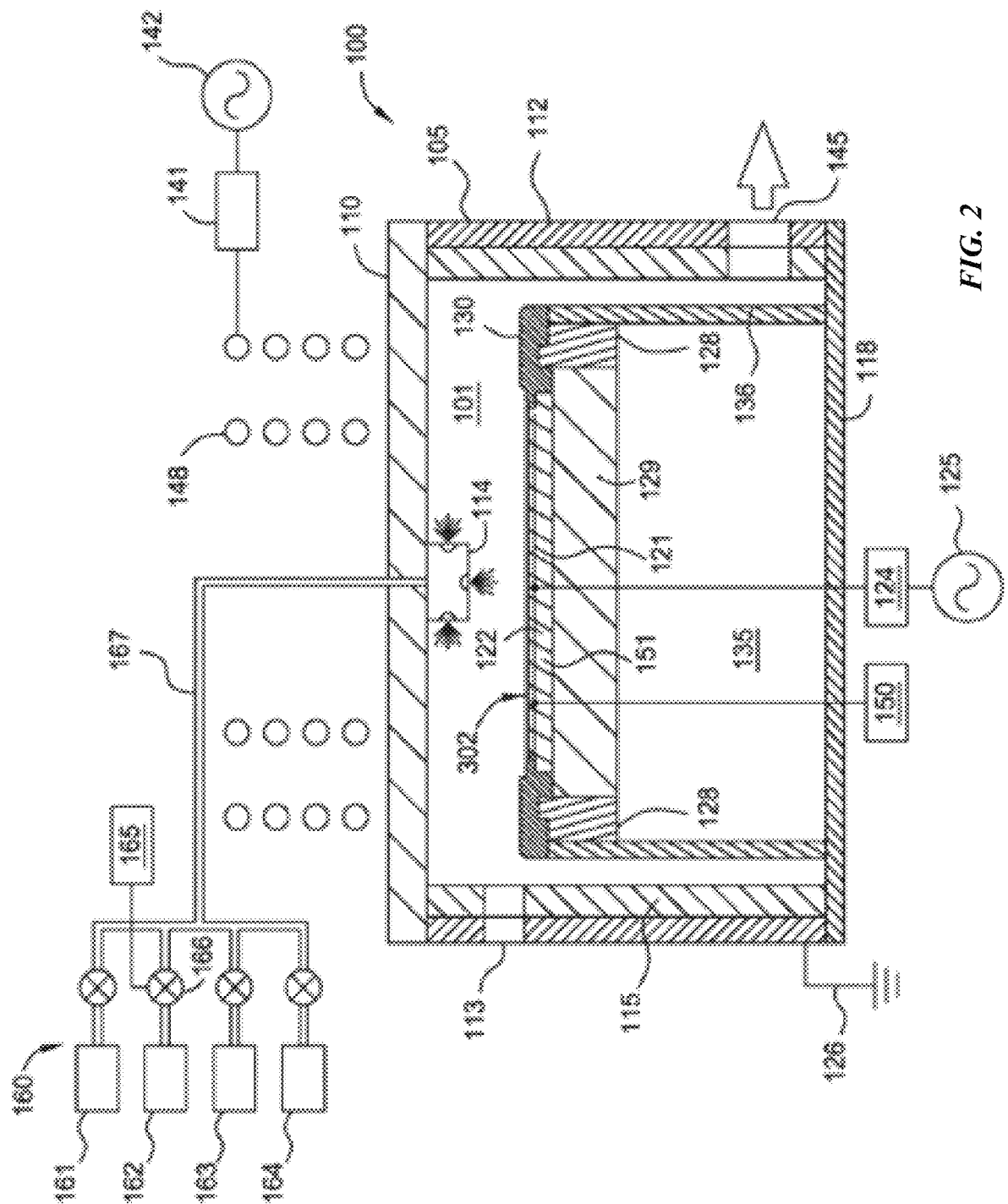
FIG. 2 shows a schematic cross-sectional view of an exemplary processing system according to some embodiments of the present technology.

FIG. 2 illustrates a schematic cross-sectional view of an exemplary processing chamber 100 suitable for patterning a material layer disposed on a substrate 302 in the processing chamber 100. The exemplary processing chamber 100 is suitable for performing a patterning process, although it is to be understood that aspects of the present technology may be performed in any number of chambers, and substrate supports according to the present technology may be included in etching chambers, deposition chambers, treatment chambers, or any other processing chamber. The plasma processing chamber 100 may include a chamber body 105 defining a chamber volume 101 in which a substrate may be processed. The chamber body 105 may have sidewalls 112 and a bottom 118 which are coupled with ground 126. The sidewalls 112 may have a liner 115 to protect the sidewalls 112 and extend the time between maintenance cycles of the plasma processing chamber 100. The dimensions of the chamber body 105 and related components of the plasma processing chamber 100 are not limited and generally may be proportionally larger than the size of the substrate 302 to be processed therein. Examples of substrate sizes include 200 mm diameter, 250 mm diameter, 300 mm diameter and 450 mm diameter, among others, such as display or solar cell substrates as well.

The chamber body 105 may support a chamber lid assembly 110 to enclose the chamber volume 101. The chamber body 105 may be fabricated from aluminum or other suitable materials. A substrate access port 113 may be formed through the sidewall 112 of the chamber body 105, facilitating the transfer of the substrate 302 into and out of the plasma processing chamber 100. The access port 113 may be coupled with a transfer chamber and/or other chambers of a substrate processing system as previously described. A pumping port 145 may be formed through the sidewall 112 of the chamber body 105 and connected to the chamber volume 101. A pumping device may be coupled through the pumping port 145 to the chamber volume 101 to evacuate and control the pressure within the processing volume. The pumping device may include one or more pumps and throttle valves.

A gas panel 160 may be coupled by a gas line 167 with the chamber body 105 to supply process gases into the chamber volume 101. The gas panel 160 may include one or more process gas sources 161, 162, 163, 164 and may additionally include inert gases, non-reactive gases, and reactive gases, as may be utilized for any number of processes. Examples of process gases that may be provided by the gas panel 160 include, but are not limited to, hydrocarbon containing gas including methane, sulfur hexafluoride, silicon chloride, carbon tetrafluoride, hydrogen bromide, hydrocarbon containing gas, argon gas, chlorine, nitrogen, helium, or oxygen gas, as well as any number of additional materials. Additionally, process gasses may include nitrogen, chlorine, fluorine, oxygen, and hydrogen containing gases such as $BCl_3$, $C_2F_4$, $C_4F_8$, $C_4F_6$, $CHF_3$, $CH_2F_2$, $CH_3F$, $NF_3$, $NH_3$, $CO_2$, $SO_2$, $CO$, $N_2$, $NO_2$, $N_2O$, and $H_2$, among any number of additional precursors.

Valves 166 may control the flow of the process gases from the sources 161, 162, 163, 164 from the gas panel 160 and may be managed by a controller 165. The flow of the gases supplied to the chamber body 105 from the gas panel 160 may include combinations of the gases form one or more sources. The lid assembly 110 may include a nozzle 114. The nozzle 114 may be one or more ports for introducing the process gases from the sources 161, 162, 164, 163 of the gas panel 160 into the chamber volume 101. After the process gases are introduced into the plasma processing chamber 100, the gases may be energized to form plasma. An antenna 148, such as one or more inductor coils, may be provided adjacent to the plasma processing chamber 100. An antenna power supply 142 may power the antenna 148 through a match circuit 141 to inductively couple energy, such as RF energy, to the process gas to maintain a plasma formed from the process gas in the chamber volume 101 of the plasma processing chamber 100. Alternatively, or in addition to the antenna power supply 142, process electrodes below the substrate 302 and/or above the substrate 302 may be used to capacitively couple RF power to the process gases to maintain the plasma within the chamber volume 101. The operation of the power supply 142 may be controlled by a controller, such as controller 165, that also controls the operation of other components in the plasma processing chamber 100.

A substrate support pedestal 135 may be disposed in the chamber volume 101 to support the substrate 302 during processing. The substrate support pedestal 135 may include an electrostatic chuck 122 for holding the substrate 302 during processing. The electrostatic chuck ("ESC") 122 may use the electrostatic attraction to hold the substrate 302 to the substrate support pedestal 135. The ESC 122 may be powered by an RF power supply 125 integrated with a match circuit 124. The ESC 122 may include an electrode 121 embedded within a dielectric body. The electrode 121 may be coupled with the RF power supply 125 and may provide a bias which attracts plasma ions, formed by the process gases in the chamber volume 101, to the ESC 122 and substrate 302 seated on the pedestal. The RF power supply 125 may cycle on and off, or pulse, during processing of the substrate 302. The ESC 122 may have an isolator 128 for the purpose of making the sidewall of the ESC 122 less attractive to the plasma to prolong the maintenance life cycle of the ESC 122. Additionally, the substrate support pedestal 135 may have a cathode liner 136 to protect the sidewalls of the substrate support pedestal 135 from the plasma gases and to extend the time between maintenance of the plasma processing chamber 100.

Electrode 121 may be coupled with a power source 150. The power source 150 may provide a chucking voltage of about 200 volts to about 2000 volts to the electrode 121. The power source 150 may also include a system controller for controlling the operation of the electrode 121 by directing a DC current to the electrode 121 for chucking and de-chucking the substrate 302. The ESC 122 may include heaters disposed within the pedestal and connected to a power source for heating the substrate, while a cooling base 129 supporting the ESC 122 may include conduits for circulating a heat transfer fluid to maintain a temperature of the ESC 122 and substrate 302 disposed thereon. The ESC 122 may be configured to perform in the temperature range required by the thermal budget of the device being fabricated on the substrate 302. For example, the ESC 122 may be configured to maintain the substrate 302 at a temperature of about −150° C. or lower to about 500° C. or higher depending on the process being performed.

The cooling base 129 may be provided to assist in controlling the temperature of the substrate 302. To mitigate process drift and time, the temperature of the substrate 302 may be maintained substantially constant by the cooling base 129 throughout the time the substrate 302 is in the cleaning chamber. In some embodiments, the temperature of the substrate 302 may be maintained throughout subsequent cleaning processes at temperatures between about −150° C. and about 500° C., although any temperatures may be utilized. A cover ring 130 may be disposed on the ESC 122 and along the periphery of the substrate support pedestal 135. The cover ring 130 may be configured to confine etching gases to a desired portion of the exposed top surface of the substrate 302, while shielding the top surface of the substrate support pedestal 135 from the plasma environment inside the plasma processing chamber 100. Lift pins may be selectively translated through the substrate support pedestal 135 to lift the substrate 302 above the substrate support pedestal 135 to facilitate access to the substrate 302 by a transfer robot or other suitable transfer mechanism as previously described.

The controller 165 may be utilized to control the process sequence, regulating the gas flows from the gas panel 160 into the plasma processing chamber 100, and other process parameters. Software routines, when executed by the CPU, transform the CPU into a specific purpose computer such as a controller, which may control the plasma processing chamber 100 such that the processes are performed in accordance with the present disclosure. The software routines may also be stored and/or executed by a second controller that may be associated with the plasma processing chamber 100.

Figure 3:
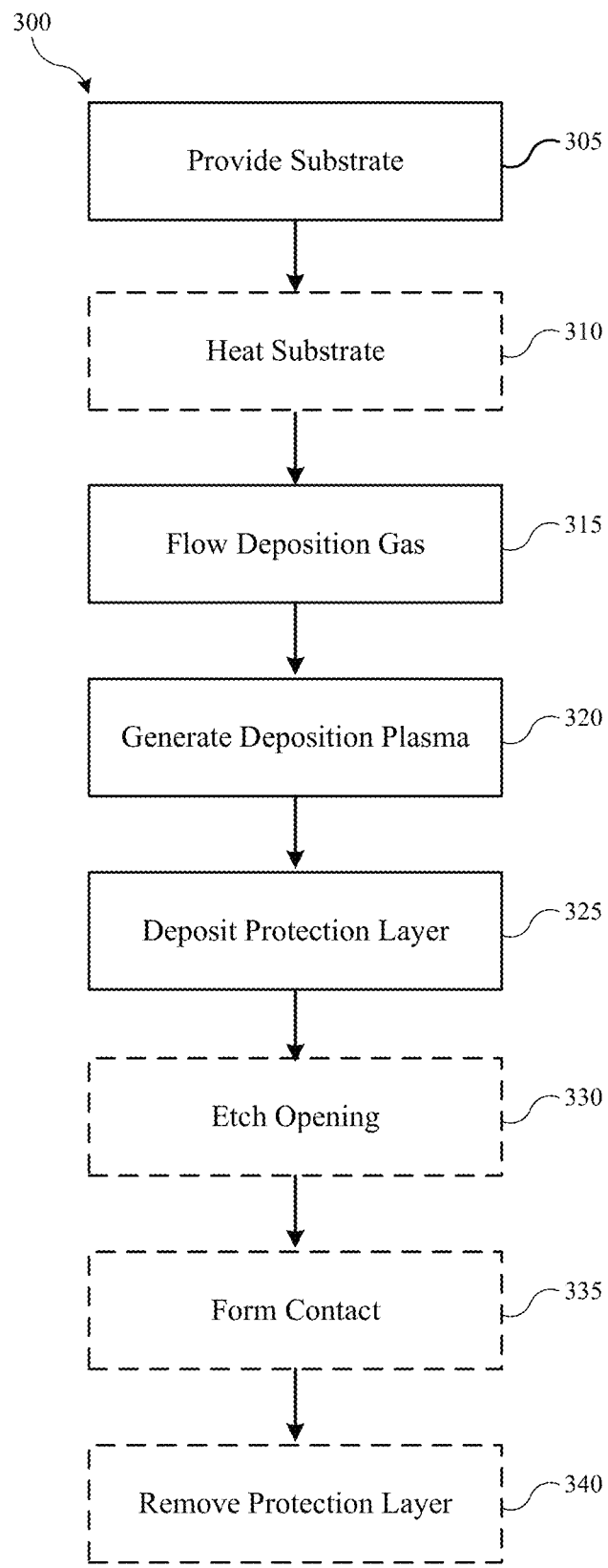
FIG. 3 shows selected operations in a method of semiconductor processing according to some embodiments of the present technology.
Figure 4:
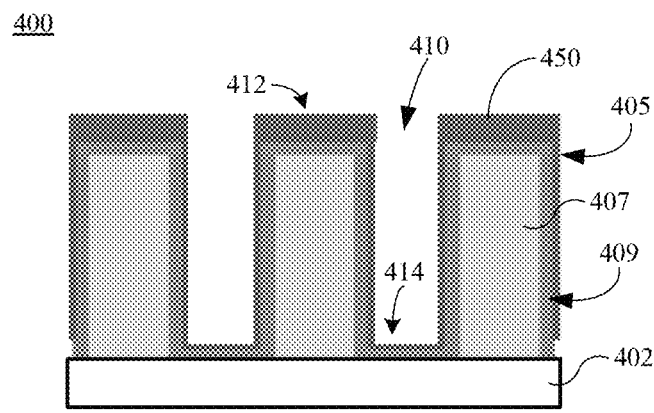
FIG. 4 shows a cross-sectional views of semiconductor structures that include trench structures according embodiments of the present technology.
Figure 5:
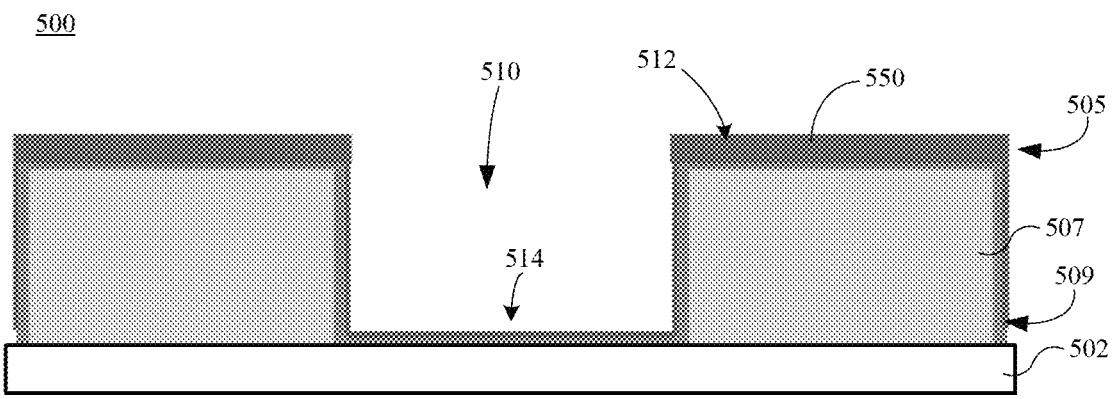
FIG. 5 shows a cross-sectional views of semiconductor structures that include additional trench structures according embodiments of the present technology.
Figure 6A:
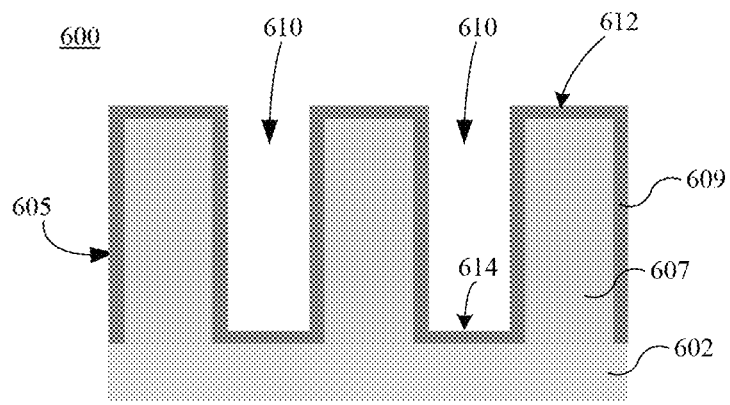
FIG. 6A shows a cross-sectional view of a semiconductor structure before the formation of a protection layer according to embodiments of the present technology.
Figure 6B:
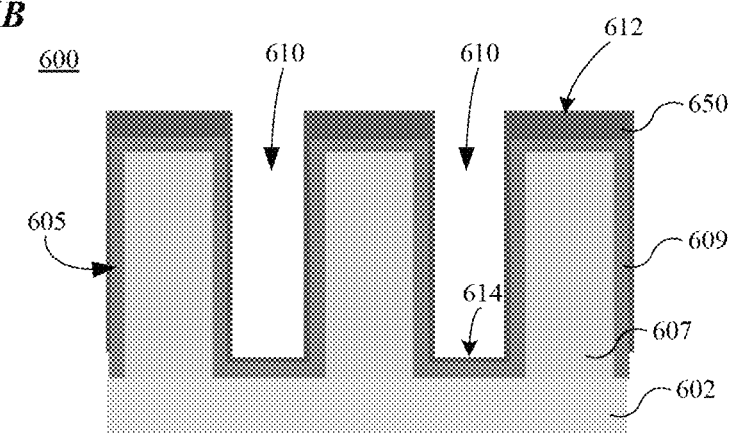
FIG. 6B shows a cross-sectional view of a semiconductor structure after the formation of a protection layer according to embodiments of the present technology.
Figure 6C:
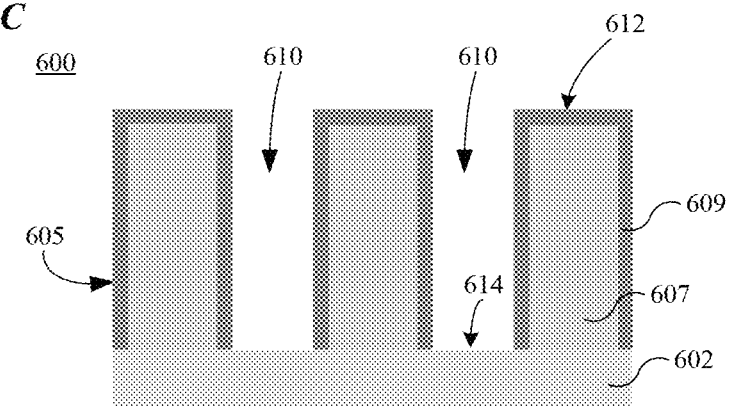
FIG. 6C shows a cross-sectional view of a semiconductor structure after an etch operation and removal of the protection layer according to embodiments of the present technology.

Chamber 100, and other embodiments of processing chambers and systems, may be used to produce semiconductor structures according to embodiments of the present technology. FIG. 3 shows exemplary operations in method 300 of making a semiconductor structure according to some embodiments of the present technology. Method 300 may be performed in one or more processing chambers, such as chamber 100, for example. Method 300 may or may not include one or more operations prior to the initiation of the method, including front-end processing, deposition, etching, polishing, cleaning, or any other operations that may be performed prior to the described operations. For example, operations to form the semiconductor structures that include one or more trenches with a top surface and a bottom surface, as well as sidewall surfaces, may be performed prior to the initiation of method 300. The methods may include a number of optional operations, which may or may not be specifically associated with some embodiments of methods according to the present technology.

FIG. 3 shows exemplary operations in a method 300 of protecting a top surface of trenches in semiconductor structures while etching openings in the bottom surface of those trenches according to embodiments of the present technology. Method 300 describes operations to form embodiments of semiconductor devices 400, 500, and 600, shown in a simplified schematic form in FIG. 4, FIG. 5, and FIGS. 6A-C, the illustrations of which will be described in conjunction with the operations of method 300. These semiconductor devices 400, 500, and 600, may include semiconductor logic devices such as CPUs and GPUs, memory devices such as DRAM, and display devices such as LEDs, among other kinds of semiconductor devices. It should be understood that FIG. 4, FIG. 5, FIGS. 6A-C, illustrate only partial schematic views with limited details, and in some embodiments, a substrate may contain any number of semiconductor sections having aspects as illustrated in the figures, as well as alternative structural aspects that may still benefit from any of the aspects of the present technology.

Method 300 includes providing a substrate at operation 305. In embodiments, the substrate may include a wafer made of silicon, silicon oxide, germanium, gallium arsenide, or aluminum nitride, among other substrate materials. In further embodiments, the substrate may include semiconductor device structures like the structures 405 formed on substrate 402, the structures 505 formed on substrate 502, and the structures 605 formed on substrate 602, shown in FIG. 4, FIG. 5, and FIGS. 6A-C, respectively. In the embodiment shown in FIG. 4, each of the structures 405 may include a base structure 407 and one or more layers 409 positioned on the base structure. In additional embodiments, the one or more layers 409 may extend to the sidewalls of the base structure 407 and across the bottom surface of the trenches between adjacent base structures. In yet further embodiments, each of the one or more layers 409 may include a liner layer or a spacer layer, among other types of layers. In the embodiment shown in FIG. 5, each of the structures 505 may include a base structure 507 and one or more layers 509 positioned on the base structure. In additional embodiments, the one or more layers 509 may extend to the sidewalls of the base structure 507 and across the bottom surface of the trenches between adjacent base structures. In yet further embodiments, each of the one or more layers 509 may include a liner layer or a spacer layer, among other types of layers. In the embodiment shown in FIGS.

6A-C, each of the structures 605 may include a base structure 607 and one or more layers 609 positioned on the base structure. In additional embodiments, the one or more layers 609 may extend to the sidewalls of the base structure 607 and across the bottom surface of the trenches between adjacent base structures. In yet further embodiments, each of the one or more layers 609 may include a liner layer or a spacer layer, among other types of layers.

In embodiments, the base structures 407, 507, and 607, may include at least one of a semiconductor material or a dielectric material. In embodiments, the semiconductor material may include silicon, silicon carbide, germanium, gallium arsenide, gallium nitride, gallium phosphide, and cadmium sulfide, among other semiconductor materials. In more embodiments, the dielectric material may include silicon oxide, silicon-carbon-oxide, silicon nitride, silicon oxynitride, titanium dioxide, aluminum oxide, and zinc oxide, among other dielectric materials. In yet more embodiments, the one or more layers 409, 509, and 609, may include one or more semiconductor materials or dielectric materials.

In embodiments, the structures 405 and 605 include one or more trenches 410 and 610 that include a top surface 412 and 612 a bottom surface 414 and 614. The trenches 410 and 610 may be characterized by an aspect ratio that compares the height of the trench to the width of the trench bottom. In further embodiments, trenches 410 and 610 may have an aspect ratio greater than or about 2:1, greater than or about 2.5:1, greater than or about 3:1, greater than or about 3.5:1, greater than or about 4:1, greater than or about 4.5:1, greater than or about 5:1, greater than or about 5.5:1, greater than or about 6:1, greater than or about 6.5:1, greater than or about 7:1, greater than or about 7.5:1, greater than or about 8:1, greater than or about 8.5:1, greater than or about 9:1, greater than or about 9.5:1, greater than or about 10:1, or more. In still further embodiments, the width of the trench bottom may be less than or about 50 nm, less than or about 45 nm, less than or about 40 nm, less than or about 35 nm, less than or about 30 nm, less than or about 25 nm, less than or about 20 nm, less than or about 15 nm, less than or about 10 nm, or less.

In additional embodiments, the structures 505 may also include one or more trenches 510 that have a top surface 512 and a bottom surface 514. In contrast to the trenches 510 in the structures 505, the trenches 510 may be characterized by lower aspect ratios and wider trench bottoms. In embodiments, the trenches 510 may be characterized by an aspect ratio less than or about 1:1, less than or about 1:2, less than or about 1:5, less than or about 1:10, less than or about 1:20, less than or about 1:50, less than or about 1:80, less than or about 1:100, or less. In further embodiments, the trenches 510 may have a trench bottom width that is greater than or about 100 nm, greater than or about 110 nm, greater than or about 120 nm, greater than or about 130 nm, greater than or about 140 nm, greater than or about 150 nm, greater than or about 160 nm, greater than or about 170 nm, greater than or about 180 nm, greater than or about 190 nm, greater than or about 200 nm, or more.

In further embodiments, semiconductor device structures like the structures 405, 505, and 605, may be combined on the same substrate. In these embodiments, a first portion of the semiconductor devices structures may have spatial characteristics similar to structures 405 and 605 while a second portion of the device structures may have spatial characteristics similar to structures 505. In more embodiments, the first and second portions of the device structures may be positioned in separate regions on the substrate, while in additional embodiments, the first and second portions of the device structures may be intermixed in a portion of the substrate or across the whole substrate.

Method 300 may also include heating the provided substrate, such as the substrate 402, 502, and 602, in the reaction chamber at optional operation 310. In embodiments where the substrate is heated, the heating may originate from below the substrate. In additional embodiments, the heating of the substrate may be done by one or more heating elements in an electrostatic chuck (ESC) in contact with the substrate. In still further embodiments, the substrate may be heated such that the bottom surface of the trenches may be characterized by a temperature greater than or about 50° C., greater than or about 60° C., greater than or about 70° C., greater than or about 80° C., greater than or about 90° C., greater than or about 100° C., greater than or about 110° C., greater than or about 120° C., greater than or about 130° C., greater than or about 140° C., greater than or about 150° C., or more. As noted above, embodiments of the present technology can create a higher deposition rate in the top surface of a trench relative to the bottom surface over a wide range of ESC and substrate temperatures.

Method 300 may further include flowing a deposition gas into a reaction chamber at operation 315. In embodiments, the deposition gas may include a carbon-containing gas. In additional embodiments, the carbon-containing gas may include a carbon-and-hydrogen-containing gas such as methane. In yet more embodiments, the deposition gas may also include one or more additional compounds having a molecular mass that balances the mass transport and electron temperature effects that increase the selectivity for depositing a thicker carbon-containing layer on the top surface of the trenches than the bottom surface. Embodiments of the deposition gas may include one or more additional gases that have an atomic or molecular mass of less than or about 30 g/mol. In additional embodiments, the additional gases may have an atomic or molecular mass of greater than or about 5 g/mol. In still further embodiments the additional gases may include a nitrogen-containing gas. In yet more embodiments, the nitrogen-containing gas may be molecular nitrogen ($N_2$).

In embodiments, the deposition gases may include the carbon-containing gas and an additional gas (e.g., a carrier gas). In additional embodiments, the carbon-containing gas may be supplied to a plasma excitation region of the substrate-containing reaction chamber at a flow rate of less than or about 50 standard cubic centimeters per minute (sccm), less than or about 40 sccm, less than or about 30 sccm, less than or about 20 sccm, less than or about 10 sccm, or less. In further embodiments, the additional gas may be supplied to the plasma excitation region of the substrate-containing reaction chamber at a flow rate of greater than or about 200 sccm, greater than or about 250 sccm, greater than or about 300 sccm, greater than or about 350 sccm, greater than or about 400 sccm, greater than or about 450 sccm, greater than or about 500 sccm, or more. In more embodiments, the deposition gas may be characterized by a flow rate ratio of the carbon-containing gas to the one or more additional gases that is less than or about 1:5, less than or about 1:10, less than or about 1:15, less than or about 1:20, or less.

In additional embodiments, the additional gases have an atomic or molecular mass that is not large enough to increase the transport rate of the carbon-containing gas to the bottom surface of the trenches. It has been determined that compounds lighter than or about the molecular mass of diatomic nitrogen ($N_2$) have significantly lower transport rates for the carbon-containing compounds in the deposition gas than heavier compounds. In embodiments, the deposition gas may be free of these heavier compounds, such as argon, that are commonly used as carrier gases in the deposition of carbon-containing layers, and which may increase deposition along the base of the trenches by increasing delivery through the trench. It has also been determined that compounds significantly lighter than the molecular mass of diatomic nitrogen ($N_2$) can substantially increase the electron temperature of a deposition plasma formed from the deposition gas, which can increase a surface temperature of the substrate. In embodiments, the deposition gas may be free of these light compounds, such as helium and/or molecular hydrogen ($H_2$), that are commonly used as carrier and reactive gases in the deposition of carbon-containing layers.

Method 300 still further includes generating a deposition plasma from the deposition gas at operation 320. In embodiments, the deposition plasma may be generated by delivering power from an RF power source to the deposition gas. In additional embodiments, the RF power source may be a capacitively-coupled plasma power source or an inductively-coupled plasma power source. In more embodiments, the RF power source may deliver RF power to the deposition gas and deposition plasma that is characterized by a power of less than or about 500 Watts, less than or about 450 Watts, less than or about 400 Watts, less than or about 350 Watts, less than or about 300 Watts, less than or about 250 Watts, less than or about 200 Watts, or less. In still more embodiments, during the generation of the deposition plasma, the reaction chamber may be characterized by a deposition plasma pressure of less than or about 10 mTorr, less than or about 9 mTorr, less than or about 8 mTorr, less than or about 7 mTorr, less than or about 6 mTorr, less than or about 5 mTorr, less than or about 4 mTorr, less than or about 3 mTorr, less than or about 2 mTorr, less than or about 1 mTorr, or less.

The power supplied to generate the deposition plasma and the plasma deposition temperature can affect the plasma temperature (i.e., the electron temperature). As noted above, it has been determined that the electron temperature of the deposition plasma affects the selectivity of the deposition rate for a carbon-containing layer between a top surface and a bottom surface of the trenches of semiconductor device structures. In embodiments, the electron temperature of the deposition plasma may be characterized as less than or about 5 eV, less than or about 4.5 eV, less than or about 4 eV, less than or about 3.5 eV, less than or about 3 eV, less than or about 2.5 eV, less than or about 2 eV, less than or about 1.5 eV, less than or about 1 eV, or less. By producing a lower temperature plasma in conjunction with increased temperature at the bottom of the trenches due to heating from below as previously described, the present technology may produce a temperature difference between the top surface and the bottom surface of the trench due to thermal transport effects described below. Accordingly, in some embodiments of the present technology, the temperature at the top surface of the trench may be greater than or about 1° C. below the temperature at the bottom of the trench during deposition, and may be greater than or about 2° C. below the temperature at the bottom of the trench, greater than or about 3° C. below the temperature at the bottom of the trench, greater than or about 4° C. below the temperature at the bottom of the trench, greater than or about 5° C. below the temperature at the bottom of the trench, greater than or about 6° C. below the temperature at the bottom of the trench, greater than or about 7° C. below the temperature at the bottom of the trench, or more. This may further increase the deposition at the top of the trench due to increased sticking of the carbon material from the lower temperature.

Method 300 additionally includes depositing a protection layer from the deposition plasma at operation 325. In embodiments of the present technology, this protection layer may be a carbon-containing layer 450, 550, and 650, that is selectively deposited on the substrate 402, 502, and 602, respectively. In further embodiments, the selective deposition deposits the carbon-containing layer at a greater thickness on a top surface of the trenches in the substrate than in the bottom surface of the trenches. In still further embodiments the as-deposited carbon-containing layer may be characterized by a ratio of top-surface thickness to bottom-surface thickness of greater than or about 3:1, greater than or about 3.25:1, greater than or about 3.5:1, greater than or about 3.75:1, greater than or about 4:1, greater than or about 4.25:1, greater than or about 4.5:1, greater than or about 4.75:1, greater than or about 5:1, or more.

In embodiments, the as-deposited carbon-containing layer may have a top-surface thickness of greater than or about 5 nm, greater than or about 6 nm, greater than or about 7 nm, greater than or about 8 nm, greater than or about 9 nm, greater than or about 10 nm, or more. In yet more embodiments, the as-deposited carbon-containing layer may have a bottom-surface thickness of less than or about 2 nm, less than or about 1.9 nm, less than or about 1.8 nm, less than or about 1.7 nm, less than or about 1.6 nm, less than or about 1.5 nm, less than or about 1.4 nm, less than or about 1.3 nm, less than or about 1.2 nm, less than or about 1.1 nm, less than or about 1 nm, or less. In embodiments, the as-deposited carbon layer may also be formed on the sidewalls of the trenches. In further embodiments, the as-deposited carbon layer may have sidewall thickness that is less than the top-surface thickness. In still further embodiments, the as-deposited carbon layer may have a sidewall thickness that is the same as or greater than the bottom-surface thickness. In additional embodiments, the carbon-containing layer may be deposited in less than or about 60 seconds, less than or about 50 seconds, less than or about 40 seconds, less than or about 30 seconds, less than or about 20 seconds, less than or about 10 seconds, less than or about 5 seconds, or less.

In additional embodiments, the difference in the deposition rate of the carbon-containing layer between the top and bottom surface of the trenches may depend on the aspect ratio of each trench. Trenches with higher aspect ratios may have a greater difference in the deposition rate of the carbon-containing layer than trenches with lower aspect ratios for the same deposition conditions. This may be due, at least in part, to differences in thermal conductivity between trenches with narrower and wider bottom widths. Trenches with narrower bottom widths may have lower thermal conductivities in the bottom surface material due to shorter mean free paths for phonon conductivity though the material. In contrast, trenches with wider bottom widths may have higher thermal conductivities in the bottom surface material due to longer mean free paths for phonon conductivity though the material. In embodiments, the higher thermal conductivity of the bottom surface material in the wider trench bottoms results in higher temperatures at the bottom surface, which can reduce the deposition rate of the carbon-containing layer at the bottom surface relative to the top surface of the trench. In embodiments, narrower trenches with aspect ratios greater than or about 2:1 may have a higher top-surface-to-bottom-surface thickness ratio than wider trenches with aspect ratios less than or about 1:1. In further embodiments, the difference in the thickness ratios between the narrower trenches and the wider trenches may be greater than or about 1%, greater than or about 2.5%, greater than or about 5%, greater than or about 7.5%, greater than or about 10%, greater than or about 15%, greater than or about 20%, greater than or about 25%, greater than or about 30%, greater than or about 40%, greater than or about 50%, or more. As noted above, embodiments of the present technology can create a higher deposition rate in the top surface of a trench relative to the bottom surface over a wide range trench widths.

In additional embodiments, the carbon-containing layer may include solid carbon. In still further embodiments, the solid carbon may include a carbon polymer. In yet further embodiments, the carbon-containing layer may silicon, oxygen, and carbon each in amounts less than or about 5 wt. %, less than or about 4 wt. %, less than or about 3 wt. %, less than or about 2 wt. %, less than or about 1 wt. %, less than or about 0.5 wt. %, less than or about 0.1 wt. %, or less.

In embodiments, substrates that include the present carbon-containing layers, formed with different top and bottom surface thickness on the trenches of the substrate, may be used in a variety of processes that form openings in the bottom surfaces of the trenches. In further embodiments these processes may include high-aspect ratio depositions, via formation, and electrical contact formation, among other processes.

In the embodiment discussed in method 300, the method includes etching an opening in the bottom surface of the trenches of the semiconductor device structures at operation 330. In embodiments, the opening may be etched with a dry etch process such as reactive ion etching (ME). In further embodiments, the etching operation 330 may be performed in the same reaction chamber without breaking vacuum by evacuating the carbon-containing deposition gas and supplying a etch gas to the chamber. In still further embodiments, an etch plasma may be formed from the etch gas, and ionized etchants may be anisotropically accelerated toward the substrate by applying a bias voltage between the etch plasma and the substrate. In embodiments, the etch gases may include a fluorine containing gas such as $CF_3H$, and a carrier gas such as nitrogen ($N_2$). In additional embodiments, the reaction chamber may be characterized by a pressure of greater than or about 1 mTorr, greater than or about 2 mTorr, greater than or about 3 mTorr, greater than or about 4 mTorr, greater than or about 5 mTorr, or more during the etching operation. In further embodiments, the etch plasma may be formed by providing the etch gas with power from a plasma power source such as an RF power source. In embodiments the provided power may be characterized as greater than or about 300 W, greater than or about 400 W, greater than or about 500 W, greater than or about 600 W, greater than or about 700 W, greater than or about 800 W, or more. In more embodiments, the bias voltage between the etch plasma and the substrate may be characterized as greater than or about 150 VDC, greater than or about 160 VDC, greater than or about 170 VDC, greater than or about 180 VDC, greater than or about 190 VDC, greater than or about 200 VDC, or more. In still more embodiments, the bias power may be characterized as greater than or about 50 W, greater than or about 60 W, greater than or about 70 W, greater than or about 80 W, greater than or about 90 W, greater than or about 100 W, or more.

In embodiments, the ionized etchants may bombard and react with the carbon-containing layer on both the top surface and the bottom surface of the trenches. In further embodiments, the ionized etchants remove the portion of the carbon-containing layer on the bottom surface of the trenches to form a portion of the opening in the bottom surface. In yet more embodiments, the ionized etchants also reduce the thickness of the portion of the carbon-containing layer formed on the top surface of the trenches, but does not break through the layer on the top surface. In still further embodiments, the ionized etchants also reduce the thickness of the top portion of the carbon-containing layer by less than or about 90%, less than or about 80%, less than or about 70%, less than or about 60%, less than or about 50%, less than or about 40%, or less.

Method 300 may include forming an electrically conductive contact in the etched opening at optional operation 335. In embodiments, the electrically conductive contact, such as a low-resistance ohmic contact, may be formed by depositing an electrically conductive material in the etched opening. In additional embodiments, the deposition techniques may include sputtering, physical vapor deposition, and chemical vapor deposition, among other deposition techniques. In yet more embodiments, the electrically conductive material may be one or more metals such as aluminum, silicon, tungsten, copper, and titanium, among other metals.

Method 300 may optionally include removing the protection layer at operation 340. In embodiments, this may include the removal of carbon-containing layer 650 from structures 605 as shown by the absence of the carbon-containing layer 650 in FIG. 6C. In additional embodiments, the protection layer is a carbon-containing layer that can be removed by exposing the layer to an oxidizing gas or plasma that reacts with the carbon to form gaseous carbon monoxide and/or carbon dioxide that are evacuated from the reaction chamber. In further embodiments, the carbon layer may be removed by an oxygen plasma or a plasma formed from nitrogen ($N_2$) and hydrogen ($H_2$) gases. In yet further embodiments, the carbon layer can be removed in the same reaction chamber used for the deposition and etching operations, or the carbon layer can be removed in a separate chamber configured to remove carbon polymer layers.

Embodiments of the present technology like method 300 include operations to fabricate semiconductor device structures with less damage to the top regions of the device structures caused by etching operations. These operations include the selective deposition of a protection layer, such as a carbon-containing layer, on the trenches of the device structures. The selective deposition forms thicker layers of the protection layers on the top surface of the trenches compared to the bottom surface where an opening may be etched for a contact. Thus, embodiments of the present technology provide fabrication methods with reduced damage to semiconductor device structures as the sizes of the devices structures become smaller and the density of the structures on a semiconductor substrate becomes higher.

In the preceding description, for the purposes of explanation, numerous details have been set forth in order to provide an understanding of various embodiments of the present technology. It will be apparent to one skilled in the art, however, that certain embodiments may be practiced without some of these details, or with additional details.

Having disclosed several embodiments, it will be recognized by those of skill in the art that various modifications, alternative constructions, and equivalents may be used without departing from the spirit of the embodiments. Additionally, a number of well-known processes and elements have not been described in order to avoid unnecessarily obscuring the present technology. Accordingly, the above description should not be taken as limiting the scope of the technology.

Where a range of values is provided, it is understood that each intervening value, to the smallest fraction of the unit of the lower limit, unless the context clearly dictates otherwise, between the upper and lower limits of that range is also specifically disclosed. Any narrower range between any stated values or unstated intervening values in a stated range and any other stated or intervening value in that stated range is encompassed. The upper and lower limits of those smaller ranges may independently be included or excluded in the range, and each range where either, neither, or both limits are included in the smaller ranges is also encompassed within the technology, subject to any specifically excluded limit in the stated range. Where the stated range includes one or both of the limits, ranges excluding either or both of those included limits are also included.

As used herein and in the appended claims, the singular forms "a", "an", and "the" include plural references unless the context clearly dictates otherwise. Thus, for example, reference to "a layer" includes a plurality of such layers, and reference to "the protrusion" includes reference to one or more protrusions and equivalents thereof known to those skilled in the art, and so forth.

Also, the words "comprise(s)", "comprising", "contain(s)", "containing", "include(s)", and "including", when used in this specification and in the following claims, are intended to specify the presence of stated features, integers, components, or operations, but they do not preclude the presence or addition of one or more other features, integers, components, operations, acts, or groups.

The invention claimed is:

1. A semiconductor processing method comprising:
    providing a substrate to a reaction chamber, wherein the substrate comprises substrate trenches having a top surface and a bottom surface;
    flowing a deposition gas into a plasma excitation region of the reaction chamber, wherein the deposition gas comprises a carbon-containing gas and a nitrogen-containing gas;
    generating a deposition plasma from the deposition gas, wherein the deposition plasma is characterized by an electron temperature less than 4 eV; and
    depositing a carbon-containing layer on the top surface and the bottom surface of the substrate trenches, wherein the as-deposited carbon-containing layer has a top surface-to-bottom surface thickness ratio of greater than 3:1.

2. The semiconductor processing method of claim 1, wherein the deposition gas is argon free and helium free.

3. The semiconductor processing method of claim 1, wherein the method further comprises heating the substrate to a temperature greater than 100° C. before the deposition of the carbon-containing layer.

4. The semiconductor processing method of claim 1, wherein the method further comprises etching through at least a portion of the carbon-containing layer in the bottom surface of the substrate trenches, wherein the carbon-containing layer still covers the top surface of the substrate trenches.

5. The semiconductor processing method of claim 4, wherein the method further comprises removing the carbon-containing layer from the substrate after the etching of the at least a portion of the carbon-containing layer in the bottom surface of the substrate trenches.

6. The semiconductor processing method of claim 1, wherein the carbon-containing gas comprises methane and the nitrogen-containing gas comprises molecular nitrogen.

7. The semiconductor processing method of claim 1, wherein the deposition plasma is generated by delivering RF power to the deposition gas, and wherein the RF power is characterized by a power of less than 300 Watts.

8. The semiconductor processing method of claim 1, wherein the deposition plasma is characterized by a pressure of less than 10 mTorr.

9. The semiconductor processing method of claim 1, wherein a temperature at the top surface of the trench is greater than 1° C. below the temperature at the bottom surface of the trench during deposition.

10. A semiconductor processing method comprising:
    providing a substrate to a reaction chamber, wherein the substrate comprises a first trench with a first aspect ratio greater than 2:1, and a second trench with a second aspect ratio less than 1:2, wherein each of the first trench and the second trench has a top surface and a bottom surface;
    heating the substrate to a temperature greater than 100° C.;
    flowing a deposition gas into a plasma excitation region of the reaction chamber, wherein the deposition gas comprises a carbon-containing gas and a nitrogen-containing gas;
    generating a deposition plasma from the deposition gas, wherein the deposition plasma is characterized by an electron temperature less than 4 eV; and
    depositing a carbon-containing layer on the heated substrate, wherein the as-deposited carbon-containing layer has a top surface-to-bottom surface thickness ratio of greater than 3:1 in both the first trench and the second trench.

11. The semiconductor processing method of claim 10, wherein the method further comprises:
    etching through at least a portion of the carbon-containing layer in the bottom surface of the first trench and the second trench, wherein the carbon-containing layer still covers the top surface of the first trench and the second trench; and
    removing the carbon-containing layer from the substrate after the etching of the at least a portion of the carbon-containing layer in the bottom surface of the first trench and the second trench.

12. The semiconductor processing method of claim 10, wherein the deposition plasma is characterized by an electron temperature less than 4 eV.

13. The semiconductor processing method of claim 10, wherein the first trench is characterized by a first bottom width of less than 50 nm and the second trench is characterized by a second bottom width of greater than 100 nm.

14. The semiconductor processing method of claim 10, wherein the carbon-containing layer is characterized by a top-surface thickness of greater than 5 nm, and a bottom-surface thickness of less than 1.6 nm.

15. The semiconductor processing method of claim 10, wherein the carbon-containing layer comprises solid carbon.

* * * * *